(12) United States Patent
Wu

(10) Patent No.: US 6,456,429 B1
(45) Date of Patent: Sep. 24, 2002

(54) DOUBLE-PASS OPTICAL AMPLIFIER

(75) Inventor: Yongan Wu, San Jose, CA (US)

(73) Assignee: Onetta, Inc., Sunnyvale, CA (US)

( * ) Notice: Subject to any disclaimer, the term of this patent is extended or adjusted under 35 U.S.C. 154(b) by 0 days.

(21) Appl. No.: 09/711,917

(22) Filed: Nov. 15, 2000

(51) Int. Cl.[7] ................................................. H01S 5/32
(52) U.S. Cl. ...................... 359/344; 359/347
(58) Field of Search ............................... 359/341.2, 342, 359/344, 345, 346, 347

(56) References Cited

U.S. PATENT DOCUMENTS

| | | | |
|---|---|---|---|
| 4,379,289 A | 4/1983 | Peek | 340/555 |
| 4,651,317 A | 3/1987 | Tashiro et al. | 380/86 |
| 4,745,612 A | 5/1988 | Hayakawa et al. | 372/45 |
| 4,942,366 A * | 7/1990 | Toda | 330/4.3 |
| 5,039,194 A | 8/1991 | Block et al. | 383/88 |
| 5,082,378 A * | 1/1992 | Muller et al. | 385/70 |
| 5,136,410 A | 8/1992 | Heiling et al. | 359/110 |
| 5,189,679 A | 2/1993 | Derry et al. | 372/45 |
| 5,208,183 A | 5/1993 | Chen et al. | 437/129 |
| 5,218,613 A | 6/1993 | Serreze | 372/45 |
| 5,287,377 A | 2/1994 | Fukuzawa et al. | 372/45 |
| 5,299,056 A * | 3/1994 | Kurata et al. | 359/341.1 |
| 5,334,551 A * | 8/1994 | Komatsu | 437/105 |
| 5,345,456 A | 9/1994 | Dai et al. | 372/22 |
| 5,428,471 A | 6/1995 | McDermott | 359/177 |
| 5,430,759 A | 7/1995 | Yokev et al. | 375/202 |

(List continued on next page.)

FOREIGN PATENT DOCUMENTS

EP 0321087 * 11/1988 .................. 252/582

OTHER PUBLICATIONS

Brinkmann et al. "Erbium–Doped Single– and Double–Pass Ti:LiNbO.sub.3 Waveguide Amplifiers" Oct. 1994 IEEE Journal o Quantum Electronics vol. 30, No. 10 pp. 2356–2360.*

(List continued on next page.)

Primary Examiner—Thomas H. Tarcza
Assistant Examiner—Stephen Cunningham
(74) Attorney, Agent, or Firm—Fish & Neave

(57) ABSTRACT

Novel optical amplifier designs are disclosed. The optical amplifier generally comprises an amplification section having an anti-reflection coating on a first end face and a reflector optically coupled to a second end face. The amplification section of the amplifier interacts with the input and reflected optical signals to produce an amplified optical signal. The amplification section may include rare earth doped glass amplifiers (e.g., erbium-doped amplifiers), rare earth doped waveguide amplifiers (e.g. erbium-doped waveguide amplifiers), polymer amplifiers or parametric amplifiers. The amplifier may include a waveguide structure proximate the amplification section to confine optical signals within the amplification section and/or guide signals into and out of the amplifier. The amplifier may be combined with optical components for coupling signals between optical fibers and the amplifier. The waveguide may have a modified "V" shape where the "V" with at two legs. At least one leg of the "V" is bent so that both legs intersect the first end face substantially parallel to each other.

3 Claims, 12 Drawing Sheets

U.S. PATENT DOCUMENTS

| | | | |
|---|---|---|---|
| 5,448,663 A | * 9/1995 | Faulkner et al. | 385/27 |
| 5,455,879 A | * 10/1995 | Modavis et al. | 385/33 |
| 5,490,010 A | * 2/1996 | Sharma et al. | 359/341 |
| 5,612,824 A | * 3/1997 | Si et al. | 359/652 |
| 5,636,301 A | * 6/1997 | O'Sullivan et al. | 385/24 |
| 5,761,228 A | * 6/1998 | Yano | 372/26 |
| 5,898,802 A | * 4/1999 | Chen et al. | 385/31 |
| 5,945,668 A | 8/1999 | Davidson | 250/227.15 |
| 5,946,129 A | 8/1999 | Xu et al. | 359/332 |
| 6,008,675 A | * 12/1999 | Handa | 327/96 |
| 6,014,235 A | 1/2000 | Norte | 359/109 |
| 6,028,875 A | 2/2000 | Knight et al. | 372/46 |
| 6,052,222 A | 4/2000 | Kitamaura | 359/344 |
| 6,122,306 A | 9/2000 | Sartorious et al. | 372/96 |
| 6,141,477 A | 10/2000 | Kitamura | 385/313 |
| 6,151,338 A | * 11/2000 | Grubb et al. | 372/6 |
| 6,192,058 B1 | 2/2001 | Abeles | 372/6 |
| 6,215,805 B1 | 4/2001 | Sartorious et al. | 372/50 |
| 6,285,504 B1 | * 9/2001 | Diemeer | 359/578 |
| 6,292,292 B1 | * 9/2001 | Garito et al. | 359/341 |

OTHER PUBLICATIONS

Cho et al. "Dynamically Gain–Flattened Hybrid Optical Amplifier Utilizing Erbium Doped Fiber Amplifier and Semiconductor Optical Amplifier" Sep. 1998. ECOC'98 pp. 363–364.*

Olsson "Polarlisation–Independent Configuration Optical Amplifier" Aug. 18, 1988 Electronic Letters vol. 24 No. 17 pp. 1075–1076.*

Young et al. IEEE Phot. Tech. Letts. vol. 1 No. 12, Dec. 1989.*

Silver et al. "Design and ASE Characteristics of 1550–nm Polarization Insensitive Semiconductor Optical Amplifiers Containing Tensile and Compressive Wells" IEEE Journal of Quantum Electronics, vol. 36, No. 1, pp. 118–122, Jan., 2000.

Ryu et al. "Fabrication and Analysis of Polarization Insensitive 1.55um InGaAsP/InP Quantum Well Semiconductor Optical Amplifiers" p. 642.

Liu et al. "A Study on the Polarization Sensitive Performance of the Strained Quantum Well Semiconductor Optical Amplifiers." SPIE vol. 3896, p. 494–498 Nov., Dec., 1999.

Schimpe et al. "Compact 2×2 Switch with Optical Amplifier Gates" CLEO, 1994, p. 77.

Kitamura et al. "Angled Facet S–Bend Semiconductor Optical Amplifiers for High–Gain and Large–Extinction Ratio" IEEE Photonics Technology Letters, vol. 11, No.7 (Jul., 1999).

Saini et al. "Lossless 1×2 Optical Switch Monolithically Integrated on a Passive Active Resonant Coupler (PARC) Platform" IEEE Photonics Technology Letters, vol. 12, No. 7, Jul. 2000.

* cited by examiner-

*- PRIOR ART -*

*- PRIOR ART -*

*- PRIOR ART -*

- PRIOR ART -

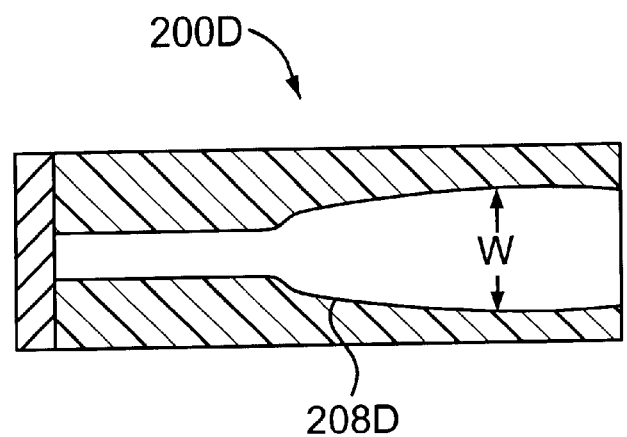
FIG. 2D
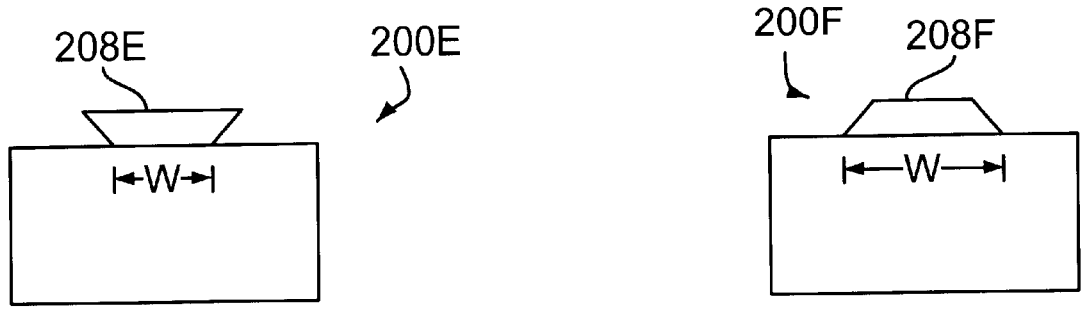
FIG. 2E  FIG. 2F

DOUBLE-PASS OPTICAL AMPLIFIER

FIELD OF THE INVENTION

This invention relates generally to optical communications. More particularly, it relates to semiconductor optical amplifiers and other SOA related devices.

BACKGROUND ART

As the demand for bandwidth in optical transmission increases, intense development efforts are focused on new amplification methods. There is also a great demand for economical amplification methods in low cost markets such as metro and enterprise networks. Semiconductor optical amplifiers may be used to provide optical amplification in a device that is less expensive, more compact, and more reliable than other commonly used amplifiers such as rare earth doped fiber amplifiers. Furthermore, semiconductor optical amplifiers can provide gain over a much broader range of wavelengths than other types of optical amplifiers. Due to its compact size and integrability the semiconductor optical amplifier can also be used in many other applications such as wavelength conversion, light modulation, gain spectra tilt control, dynamic gain equalization, etc.

Previous SOA designs utilize a single-pass design as depicted in FIG. 1. As shown in FIG. 1, an SOA 100 comprises an active layer 102 disposed between lower and upper cladding layers 104, 106. A waveguide structure 108 is incorporated into the SOA 100 to confine optical signals to an active region centered on the active layer 102. The SOA 100 receives radiation in the form of an input optical signal $OS_I$ from an input fiber 112. A first lens system 114 couples the input optical signal $OS_i$ from the input fiber 112 to the SOA 100. The SOA amplifies the input optical signal $OS_i$ and produces an amplified output signal $OS_o$. A second lens system 116 couples the output optical signal $OS_o$ to an output fiber 118.

The single-pass amplifier design suffers from certain drawbacks. One drawback of the single-pass SOA design is that very precise alignment is often necessary for the two lenses 114, 116 and the two fibers 112, 118 in order to properly couple radiation into and out of the SOA 100. The precise alignment in a single-pass SOA design increases the number of components, which adds to the complexity and cost of the SOA 100.

Another drawback is that a single-pass amplifier suffers from certain thermal management problems. A SOA, such as SOA 100 tends to generate heat as a byproduct of the amplification process. This heat tends to raise the temperature of the SOA 100. Changes in temperature can effect optical properties, such as the index of refraction and mechanical properties, such as the effective length and width, of the SOA 100. Moreover, changes in temperature tend to deteriorate the performance and reliability of the SOA 100. To overcome this, the SOA 100 is usually attached to a heat sink 120 as shown in the side elevation of FIG. 1B. The heat generated within the SOA 100 flows into the heat sink, usually by thermal conduction. To enhance thermal stability of the SOA 100, a large heat sink 120 is generally preferred. Unfortunately, the lenses 114, 116 of the single-pass SOA 100 occupy a considerable amount of space, which limits the space available for the heat sink 120. Furthermore, isolators 113, 115 are often required to prevent signals from undesirably coupling from the amplifier 100 to the input fiber 112 or from the output fiber 118 to the amplifier 100. The isolators 113, 115 add to the complexity and cost of apparatus that use the amplifier 100.

FIG. 1C depicts an amplifier 100C that uses a "V" shaped waveguide 108C and a reflector 115. The reflector 115 is located proximate the point of the "V". Incoming signals travel along one leg of the V, are reflected by the reflector and travel out of the amplifier along the other leg of the V. Although this arrangement allows the use of a large portion of the amplifier, it is still a single-pass design and suffers from the complexity and cost problems associated with other single-pass designs. Furthermore, the angle between the legs of the v-shaped waveguide 108C complicates the alignment of optical fibers that carry signals into and out of the amplifier 100C.

An additional drawback of single-pass amplifiers, such as SOA 100, is that two different channels can deplete the gain of the SOA in the same location. Gain depletion due to a channel at one wavelength can effect the gain for a channel at another wavelength resulting in undesirable cross talk between the two channels.

Furthermore, single-pass SOA's tend to have low depletion at the input end. FIG. 1D schematically illustrates the gain depletion for the SOA 100 as a function of position. Radiation is incident on SOA 100 at an input end 103, e.g. proximate lens 114. Where the gain depletion is low the amplification tends to be high and vice versa. In the SOA 100, the gain depletion increases and the amplification decreases towards an output end 105, e.g. proximate lens 116. Spontaneous emission, i.e. noise, generated near the input end 103 tends to get amplified more than spontaneous emission generated near the output end 105. The amplified spontaneous emission results in an undesirably noisy output signal.

There is a need, therefore, for an improved semiconductor optical amplifier that overcomes the above difficulties.

OBJECTS AND ADVANTAGES

Accordingly, it is a primary object of the present invention to provide an optical amplifier design that is easier to align than uses fewer components than a single-pass design. It is an additional object of the invention to provide an optical amplifier that is less subject to cross-talk than a single-pass design. It is a further object of the invention to provide an optical amplifier with a more uniform gain depletion distribution than a single-pass design. It is an additional object of the invention to provide an optical amplifier that can accommodate a larger heat sink than a single-pass design. It is an additional object of the invention to provide an optical amplifier having low cost and high reliability.

SUMMARY

The above objects and advantages are attained by a novel optical amplifier. The optical amplifier generally comprises an amplification section and a reflector. The amplification section receives optical signals at a first end face. The reflector, which is optically coupled to the second end face reflects optical signals back toward the first end face along substantially the same path through the amplifier. The amplification section may include various amplifier types including a semiconductor optical amplifiers (SOA), rare-earth-doped amplifiers such as erbium doped amplifiers, rare earth doped waveguide amplifiers, such as erbium doped waveguide amplifiers on silicon, glass or polymer substrates, parametric amplifiers or polymer amplifiers. In a particular embodiment, the amplifier is an SOA having an active layer sandwiched between two cladding layers. The reflector reflects at least a portion of the input optical signal at the first end face of the optical amplifier back toward the second. The amplification section of the amplifier interacts with the input and reflected optical signals to produce an amplified optical signal. A distance between the first and second end faces may be chosen such that standing wave intensity patterns for optical signals of different wavelengths have one or more peaks at substantially different locations in the amplifier. The reflector may optionally be characterized by a wavelength-dependent reflection coefficient to facilitate adding or removing optical signals of selected wavelengths from the amplifier.

Embodiments of the present invention provide optical amplifiers for communications apparatus that use fewer components, with less cross-talk and more uniform gain depletion distribution than single-pass design.

An alternative embodiment of the invention provides a waveguide amplifier having a bent waveguide to provide for parallel alignment of input and output fibers. The waveguide amplifier includes an amplification section having first and second end faces, wherein the first end face includes an anti-reflection coating. First and second optical fibers may be coupled to the first end face. A reflector optically is coupled to the second end face. The amplifier further includes a waveguide structure for guiding optical signals within the amplification section. The waveguide structure has a modified "V" shape with a first leg and a second leg. The first and second legs intersect at the second end face. One of the two legs is bent so that both the first and second legs intersect the first end face parallel to each other. This structure allows easier alignment of optical fibers for coupling optical signals into and out of the amplification section than in prior single-pass designs.

BRIEF DESCRIPTION OF THE FIGURES

FIGS. 2D, depicts a simplified schematic top plan view diagram of an alternative embodiment of the semiconductor optical amplifier of FIGS. 2A–2C;

FIGS. 2E–2F depict simplified schematic cross-sectional diagrams of semiconductor optical amplifiers according variations of the first embodiment of the present invention.

DETAILED DESCRIPTION

Although the following detailed description contains many specifics for the purposes of illustration. Many variations and alterations to the following details are within the scope of the invention. Accordingly, the following preferred embodiment of the invention is set forth without any loss of generality to, and without imposing limitations upon, the claimed invention.

Figure 1A:
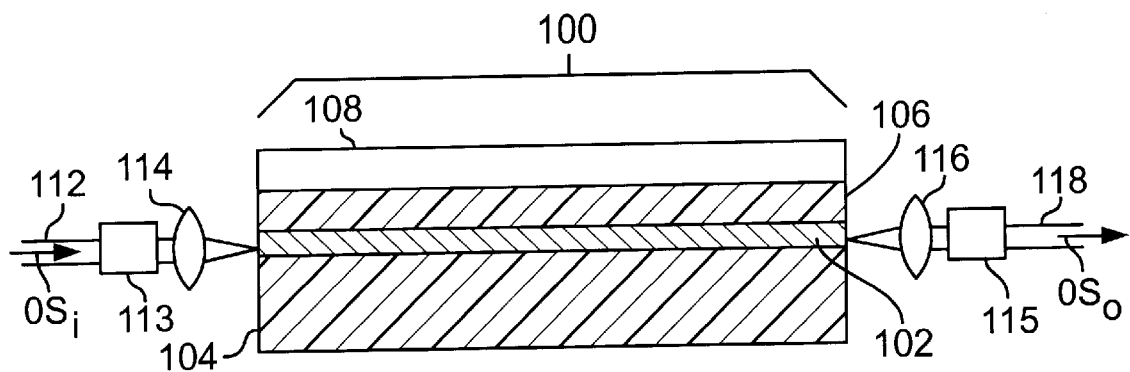
FIGS. 1A–1C depict optical communications equipment employing a single-pass optical amplifiers according to the prior art.
Figure 1B:
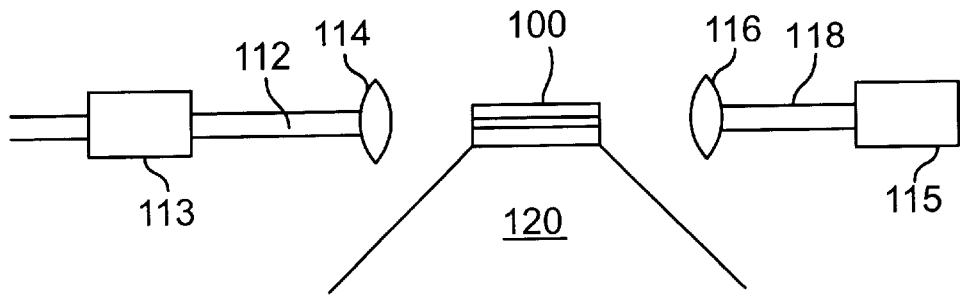
Figure 1C:
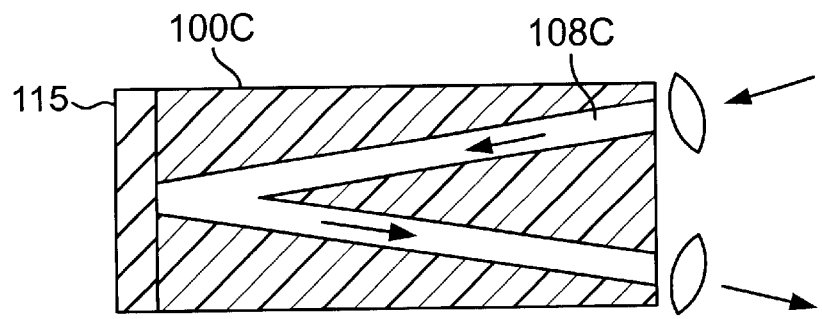
Figure 1D:
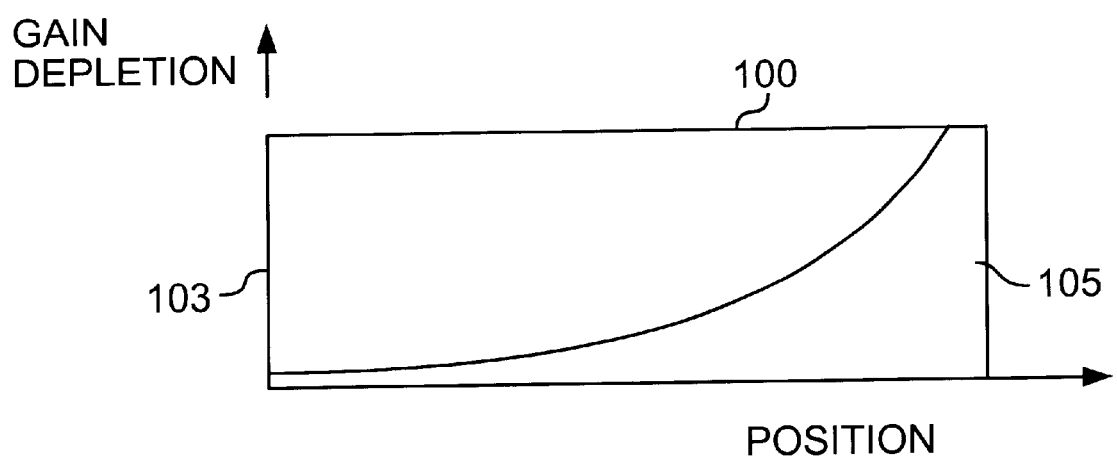
FIG. 1D depicts a graph illustrating gain depletion versus position for a single-pass semiconductor optical amplifier according to the prior art.
Figure 2C:
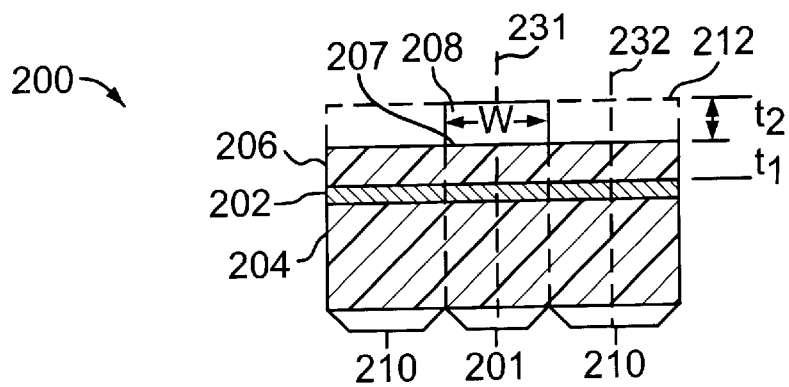
FIG. 2C depicts a simplified schematic cross-sectional view of the optical amplifier of FIG. 2B taken along line 2C—2C, which illustrates an exemplary waveguide structure according to an alternative embodiment of the invention.
Figure 2A:
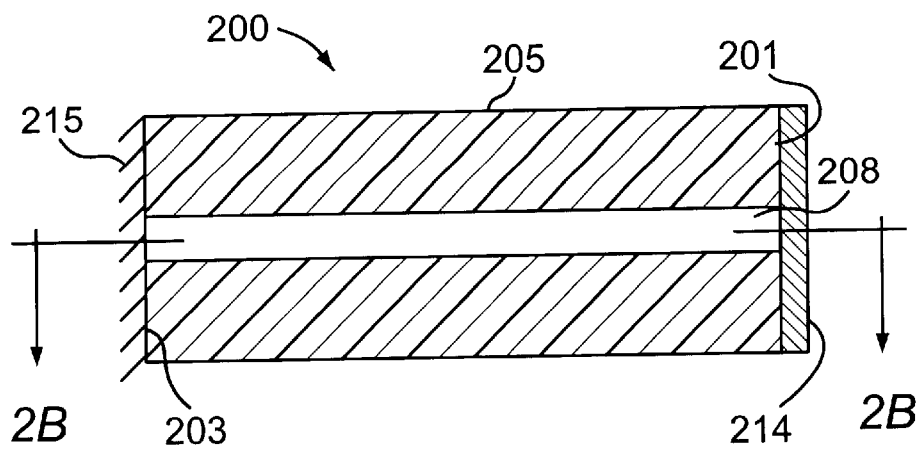
FIG. 2A depicts a simplified schematic plan view of an optical amplifier according to an embodiment of the present invention.
Figure 2B:
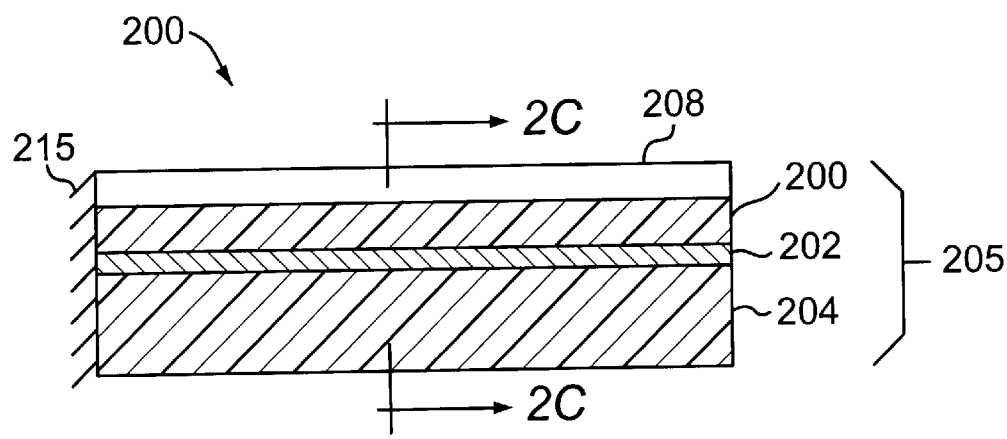
FIG. 2B depicts a simplified vertical cross-sectional schematic view of the optical amplifier according to FIG. 2A taken along line 2B—2B.

A particular embodiment of an optical amplifier 200 of the present invention is shown in FIGS. 2A–2C. The amplifier 200 generally includes an amplification section 205 and a reflector 215. The amplification section 205 may include various amplifier types including a semiconductor optical amplifiers (SOA), rare-earth-doped amplifiers such as erbium-doped amplifiers, rare earth doped waveguide amplifiers, such as erbium doped waveguide amplifiers on silicon, glass or polymer substrates, parametric amplifiers or polymer amplifiers.

By way of example, the amplification section 205 of the optical amplifier 200 is a semiconductor optical amplifier (SOA). An SOA such as the amplification section 205 generally comprises an active layer 202, lower and upper cladding layers 204, 206 and a ridge waveguide structure 208. The active layer 202 is disposed between the upper and lower cladding layers 204, 206. The ridge waveguide structure 208 is formed such that the upper cladding layer 206 lies between the active layer 202 and the ridge waveguide structure 208. The terms upper and lower are used herein for the sake of clarity and are not intended in any way to restrict the invention. The cladding layers 204, 206 may be fabricated of a p-doped n-doped or un-doped material such as InGaAs, AlGaAs, InP, GaAs, InGaAsP, AnGaAlAs, GaN, ZnSe, and the like. The active region is typically fabricated from AlGaAs, InGaAs, InGaAlAs, InGaAsP, GaN, and the like. The amplification section 205 has a first end face 201 and a second end face 203. In contrast to a laser, where internal reflection of amplified light is desired to resonate the lasing wavelength, an amplifier is often used to amplify radiation over broad spectral range. To facilitate this, the amplifier 200 includes an antireflective (AR) coating on the first end face 201 to minimize reflection of optical signals from the first end face 201. The AR coating 214 prevents incident incoming light from being reflected out of the amplifier 200, thereby enhancing input coupling.

Optical signals are generally incident on the amplification section at the first end face 201. The reflector 215 is optically coupled to the amplification section 205 proximate the second end face 203. The reflector 215 may be in the form of a reflective coating deposited on the amplification section 205 at the second end face 203. Alternatively, the reflector 215 may be a separate element optically coupled to the amplification section 205. Optical signals traverse the amplification section 205 along a forward path from the first end face 201 to the second end face 203. At the second end face 203, the reflector 215 reflects optical signals incident upon it from within the amplifier 200 back toward the first end face 201 along a reverse path through the amplifier 200 that is substantially the same as the forward path. The principal difference between the forward and reverse paths is the direction of the travel of the signal. Optical signals, therefore, traverse the amplification section 205 twice and are amplified on both the forward and reverse trips through the amplification section 205.

The double-pass configuration provides certain advantages. First, it reduces cross-talk between different wavelengths within the amplifier 200. Second, it provides a more uniform gain distribution along the length of the amplifier 200. Third it simplifies the construction of systems that use the amplifier 200 since signal may be coupled into and out of the amplifier 200 through the same optical coupling mechanism. Fourth, since signals couple in and out through one side, amplifier 200 can be constructed on a relatively large heat sink to achieve better temperature performance and reliability performance.

The reflector 215 may be less than 100% reflecting. For example, in some applications it may be desirable to allow the reflector to transmit a portion of the radiation incident upon it in order to monitor or provide feedback to the amplifier 200. Alternatively, it may be desirable for the reflector 215 to have a wavelength dependent reflection coefficient in order to add or drop an individual or group of channels through the reflector 215.

Although the above description presents a possible embodiment that uses a semiconductor optical amplifier as the amplification section 205, the invention. is in no way intended to be limited to semiconductor optical amplifiers. Those of skill in the art will recognize that the double-pass optical amplifier design may other types of amplifiers such as rare earth doped glass amplifiers (e.g., erbium-doped amplifiers), rare earth doped waveguide amplifiers (e.g. erbium-doped waveguide amplifiers), polymer amplifiers or parametric amplifiers, as the amplification section 205.

The ridge waveguide structure may be characterized by a base width W and a thickness $t_2$. In a particular embodiment, the ridge waveguide structure 208 may have a base width W of between about 3 microns and 11 microns. The ridge waveguide structure is bordered on at least two sides by a region 212 that is characterized by an index of refraction $n_3$. In the default case of air, for example, $n_3=1$. The ridge waveguide structure 208 defines within the SOA 200 an active region 201 characterized by an effective index of refraction $n_1^{eff}$. The active region is at least as thick as the active layer 202 and approximately as wide as the ridge waveguide structure 208. One or more confining regions 210, characterized by an effective index of refraction $n_2^{eff}$, border active region 201. For appropriate values of $n_1^{eff}$ and $n_2^{eff}$, the active region may behave as a waveguide structure having one or more bound lateral modes of oscillation.

It turns out that, for an SOA of the type depicted in FIGS. 2A–2B, both of the effective indexes of refraction $n_1^{eff}$ and $n_2^{eff}$ depend on the detailed structure of layers 202, 204, 206, 208 and also the thickness $t_1$ and the thickness $t_2$. By way of illustration and without loss of generality, the effective indexes of refraction $n_1^{eff}$ and $n_2^{eff}$ may be approximated by the vertical direction fundamental modal effective index across the vertical lines 231 and 232 shown in FIG. 2C. The index $n_1^{eff}$ can be fixed by design and fabrication of the wafer. For example, if the etching depth $t_2=0$, $n_1^{eff}=n_2^{eff}$. The index $n_2^{eff}$ can be adjusted by controlling the cladding thickness $t_1$ through control of the etching depth $t_2$. Thus, instead of controlling $n_1^{eff}$ and $n_2^{eff}$ individually resulting in a large uncertainty in $\Delta n=n_2^{eff}-n_1^{eff}$, we can directly control $\Delta n$ through the etching depth $t_2$.

The difference between the indexes of refraction, $\Delta n=n_1^{eff}-n_B^{eff}$, determines the modes for electromagnetic waves in the active region 201. Thus, by appropriately controlling $t_1$ and $t_2$, which may be done during manufacture, it is possible to precisely engineer the bound modes of the SOA 200.

Preferably, $t_1$ is in the range of 0.3 to 1.1 μm. More preferably, $t_1$ is in the range of 0.50 to 0.85 μm.

Many variations are possible on the semiconductor optical. amplifier 2200 depicted in FIGS. 2A–2C. For example, the cross-section of the ridge waveguide structure 208 may vary along the length thereof. FIG. 2D depicts a semiconductor optical amplifier 200D having features in common with the SOA 200. The semiconductor optical amplifier 200D includes ridge waveguide structure 208D having a variable cross-section. The base width W may be wider at the first end face and narrower at the second end face or vice versa. Alternatively the cross section may widen to a bulge or narrow to a neck in between the first and second end faces.

Other variations of the basic semiconductor optical amplifier 200 include variations of the cross-section of the ridge waveguide structure 208. The base width W of the ridge waveguide structure 208 is defined a s the width of that portion of the waveguide structure 208 that contacts the next layer between the waveguide structure 208 and the active layer 202. Although, the waveguide structure 208 is depicted as having a rectangular waveguide structure in FIG. 2C, other shapes are possible. For example, FIG. 2E depicts a semiconductor optical amplifier 200E having a waveguide structure 208E with a cross section that tapers toward the base. FIG. 2F depicts a semiconductor optical amplifier 200F having a waveguide structure 208F with a cross section that tapers away from the base. In each case it is the width at the base that determines the base width W. Those skilled in the art will be able to devise various other waveguide cross-sections that incorporate this feature.

Figure 3A:
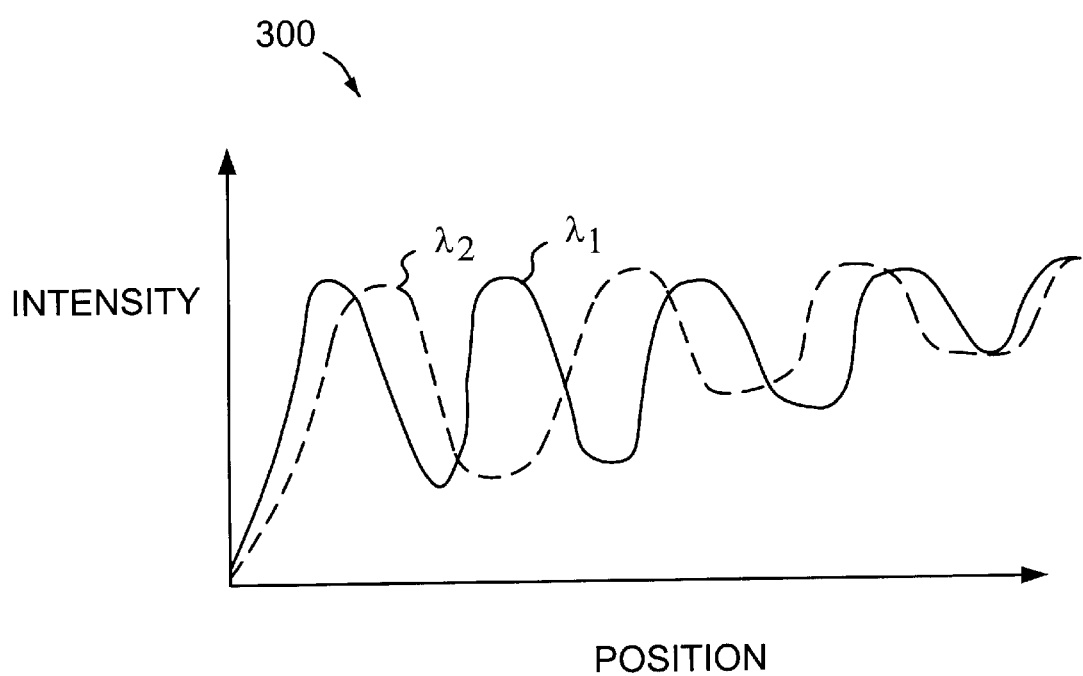
FIG. 3A depicts a graph of optical signal intensity in a double-pass optical amplifier according to an embodiment of the present invention.

FIG. 3A illustrates the advantages of the design of a double-pass amplifier, such as the amplifier 200, in reducing cross-talk. Radiation reflected from the reflector 215, interferes with radiation travelling toward the reflector 215 and establishes standing wave patterns for all wavelengths. Standing wave patterns for channels characterized by two different wavelengths $\lambda_1$, $\lambda_2$ are shown in the graph 300 of FIG. 3A. In the graph 300 intensity is plotted as a function of position along amplifier 200, e.g., in a direction substantially parallel to that of ridge waveguide structure 208. The standing wave patterns have intensity peaks in locations that depend on the wavelength of the channel and the length of the amplifier 200. Where the signal is most intense, the gain of amplifier 200 is depleted the most. For the most part, the intensity peaks for $\lambda_1$, and $\lambda_2$ do not overlap. The amplifier 200 intensity peaks for different channels occur in different locations. Therefore, the gain depletion due to one channel will have a reduced effect on other channels, thereby reducing cross talk.

Figure 3B:
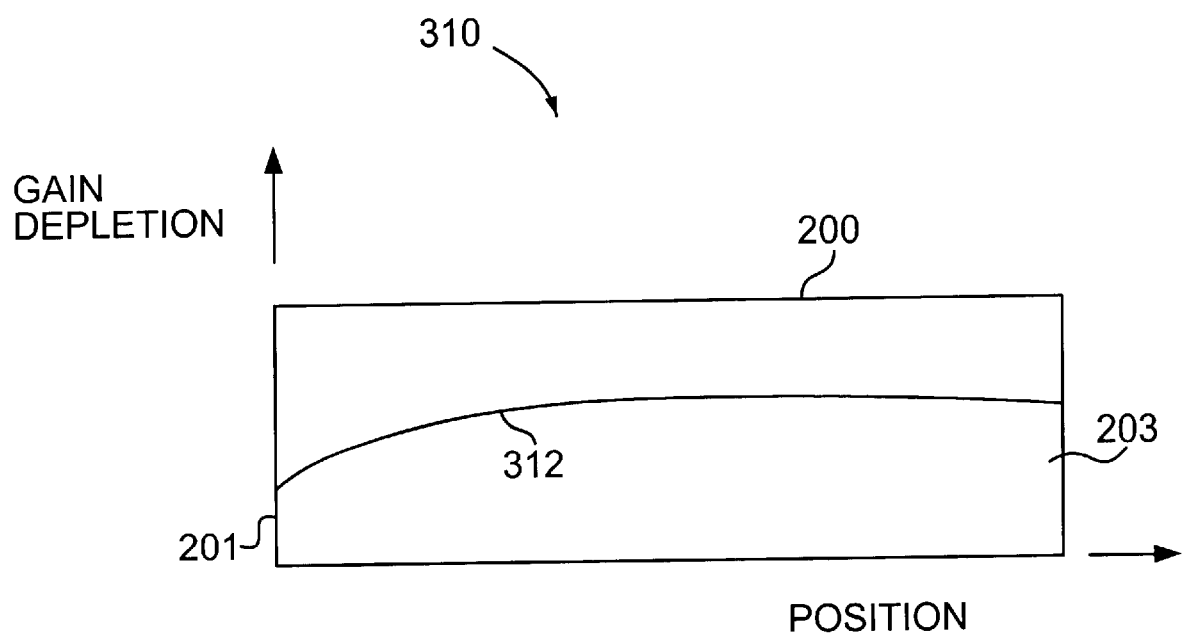
FIG. 3B depicts a graph illustrating gain depletion versus position for a semiconductor optical amplifier according to an embodiment of the present invention.

FIG. 3B illustrates the advantages of the design of a double-pass amplifier, such as the amplifier 200, in providing a more uniform gain distribution. The graph 310 of FIG. 3B depicts gain depletion as a function of position along a double-pass amplifier such as the amplifier 200. For the purposes of example, a gain distribution curve 312 is plotted along a direction substantially parallel to that of ridge waveguide structure 208. Depletion due to reflected radiation increases the gain depletion proximate the input end, e.g., first end face 201, of the amplifier 200. As a result, the gain distribution curve 312 is more uniform than in previous single-pass amplifier designs. Consequently, in a double-pass design the gain is more uniform than in previous, single-pass designs. As a result forward-coupled spontaneous emission, i.e. noise, tends to get amplified less in a double-pass amplifier than in a single-pass amplifier.

Figure 3C:
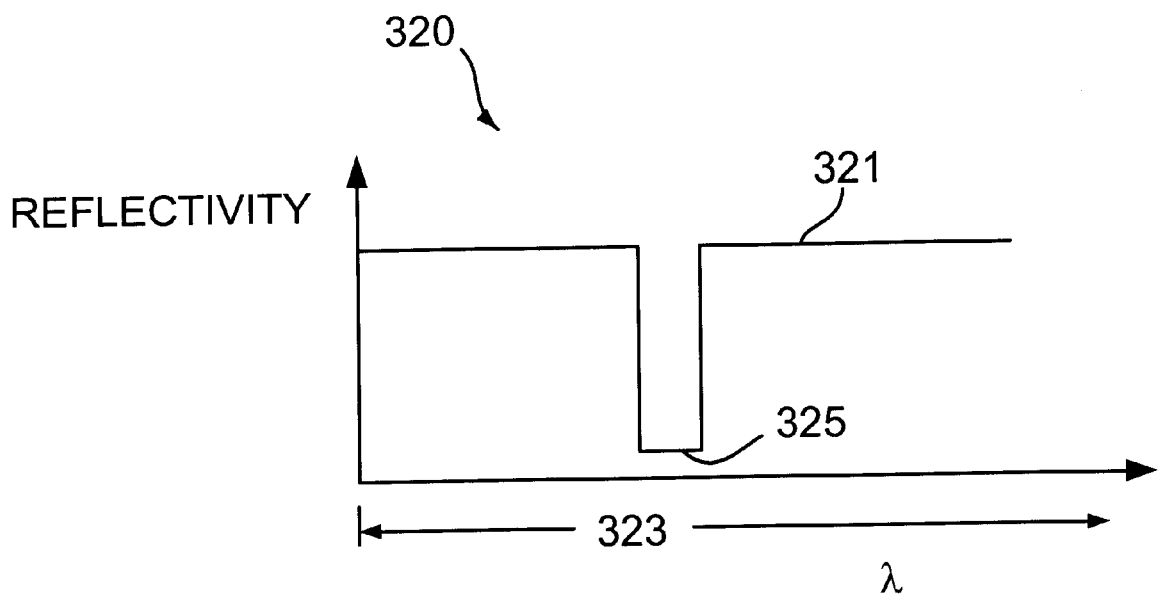
FIG. 3C depicts a graph of reflectivity versus wavelength for a semiconductor optical amplifier according to an alternative embodiment of the present invention.

The double-pass design also presents possibilities for manipulating the output signal from an amplifier such as amplifier 200. For example. the reflector 215 may have a wavelength dependent reflectivity as depicted in the graph 320 of FIG. 3C. For example, the reflectivity in the graph 320 is characterized by a plot 321 that is substantially uniform over most of the majority of a broad wavelength range 323. The reflectivity is substantially lower, however, over a narrower range 325. Although a relatively narrow range 323 is shown in FIG. 3C, those skilled in the art will recognize that a broader range may alternatively be used. Furthermore the reflector 215 may be characterized by a reflectivity that is relatively low over most the broad range 323 and substantially higher over a narrow band within the broad range 323. Wavelengths in this range can pass through the reflector in either direction to either add them or remove them from the signal in the amplifier 200.

Figure 4A:
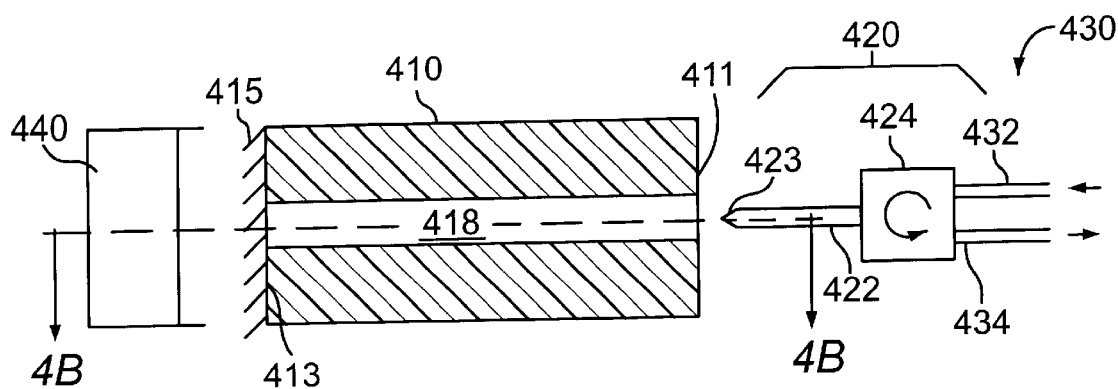
FIG. 4A depicts schematic top plan view of an optical communications apparatus according to an embodiment of the present invention.

Double-pass optical amplifiers of the type described with respect to FIGS. 2A–3C above may be incorporated into optical communications apparatus. FIG. 4A depicts a schematic top view of an optical communications apparatus 400 that employs such amplifiers. The apparatus 400 generally comprises a double pass amplifier 410 and an optical coupler 420. The amplifier 410 may contain various types of amplification sections including semiconductor optical amplifiers, rare-earth-doped glass amplifiers such as erbium-doped amplifiers, rare earth doped waveguide amplifiers, such as erbium doped waveguide amplifiers on silicon, glass or polymer substrates, parametric amplifiers or polymer amplifiers.

Figure 4B:
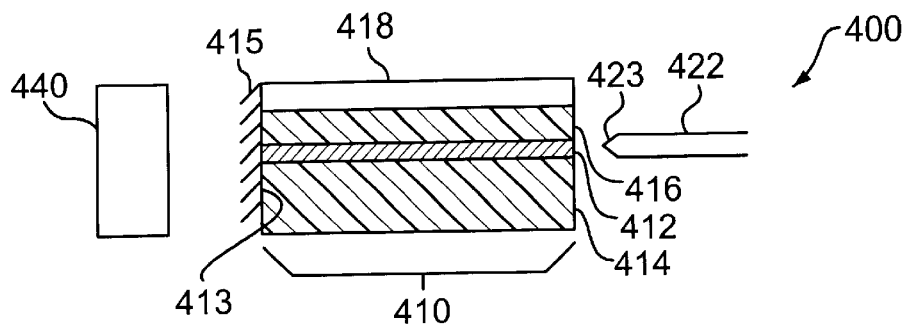
FIG. 4B depicts schematic cross-sectional view of the optical communications apparatus of FIG. 4A taken along line 4B—4B.

By way of example, the amplifier 410 may be a SOA having features in common with SOA's described above with respect to FIGS. 2A–2F. Specifically, as shown in the schematic side view of FIG. 4B the amplifier 410 may include an active layer 412 sandwiched between first and second cladding layers 414, 416. A ridge waveguide structure 418 and the active layer 412 sandwich one of the cladding layers, e.g. layer 416. The amplifier 410 includes a reflective coating 415, e.g. a multi-layer dielectric reflector or mirror, on a back face 413 of the SOA 410. The reflective coating 415 reflects optical signals coupled into the SOA 410 from input fiber 432 back through the SOA 410 towards the output fiber 434 along substantially the same path that the signals take from the front face 411 to the back face 413. The reflective coating 415 may have a wavelength dependent reflectivity whereby the coating transmits a certain wavelength and reflects others. An optical device 440 may be coupled to the SOA 410 adjacent the reflective coating 415. The optical device 440 may be a monitoring device, such as a photodiode that measures the performance of the SOA 410. Such devices may be used for monitoring and for feedback control of the performance of the amplifier 410. In addition, monitoring devices may be used to monitor the signal performance of an optical communication system of which the apparatus 400 is a part. If, the device 440 is a monitoring device, it can be placed at an angle to the amplifier waveguide structure 418 to avoid undesired feedback to the amplifier 410. Alternatively, the device 440 may be a signal source that adds a channel to the SOA 410.

The optical coupler 420 is disposed proximate a front face 411 of the amplifier 410. The Optical coupler 420 optically couples the SOA 410 to one or more optical fibers 430. The optical fibers 430 may include an input fiber 432 and an output fiber 434. In the particular embodiment depicted in FIGS. 4A–4B, the optical coupler 420 may comprise a fiber wedge 422 optically coupled to a three port optical circulator 424. The fiber wedge 422 includes a tapered section 423 of refractive material that couples light into and out of the amplifier 410. The tapered section 423 points toward the active layer 412 of the amplifier 410. Alternatively, a lens system may be used in place of the fiber wedge 422.

Figure 4C:
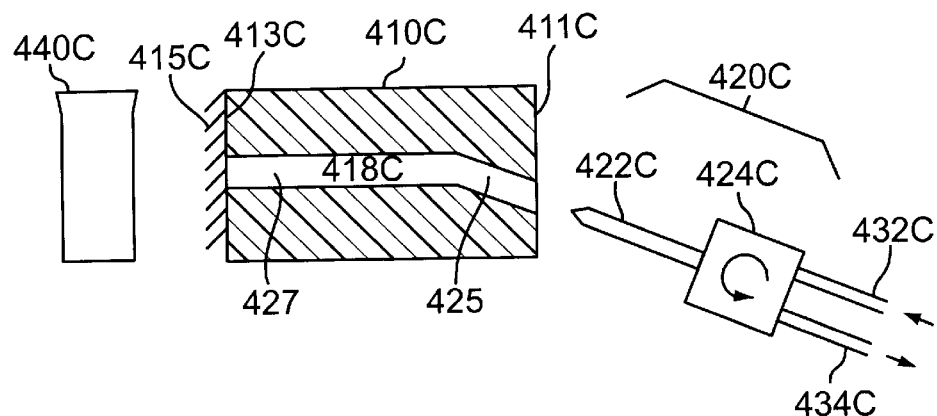
FIG. 4C depicts an simplified schematic top plan view of an optical communications apparatus according to a variation of the/embodiment depicted in FIGS. 4A–4B.
Figure 4D:
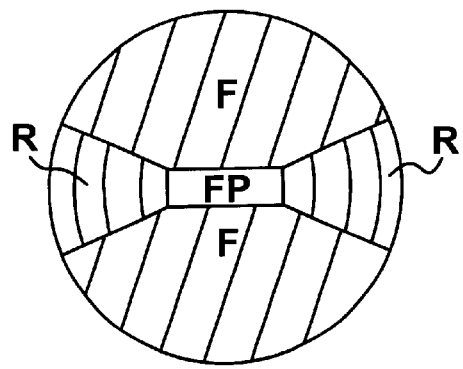
FIGS. 4D–4E depict simplified schematic front elevation views of fiber wedges.
Figure 4E:
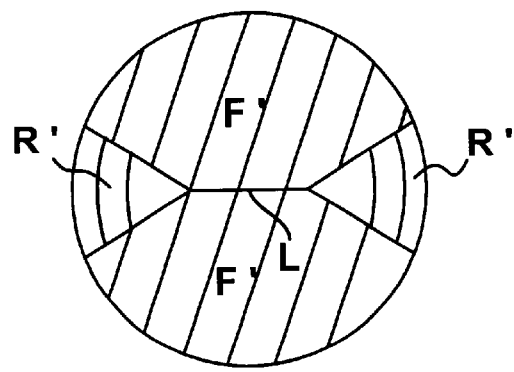

The tapered section 423 of the fiber wedge 422 may be of any suitable tapered shape for coupling light to or from a fiber. Exemplary shapes are depicted in FIGS. 4D–4E. The fiber wedges may include both flat and rounded tapering portions. FIG. 4D depicts a tapered section 423D of a fiber wedge. The tapered section 423D includes flat tapered sections F and rounded tapered sections R. The rounded and flat tapered sections terminate in a flat section FP that is substantially perpendicular to the axis of the fiber wedge. The flat section FP can also be formed at an angle with respect to a plane perpendicular to the axis of the fiber wedge to avoid unwanted feedback. FIG. 4E depicts an alternative tapered section 423E of a fiber wedge having flat tapered sections F' and rounded tapered sections R' that terminate in line segment L. The wedge surface can be AR coated to avoid light loss and undesired reflections.

Other variations on the basic apparatus 400 are possible. For example, FIG. 4C depicts an apparatus 400C having an amplifier 410C with a bent waveguide 418C. The bent waveguide 418C includes an angled portion 425 and a normal portion 427. The angled portion 425 makes an angle with respect to the normal of a front face 411C. The normal portion 427 is substantially normal, i.e., perpendicular, to a back face 413C. The angled portion 425 of the waveguide 418C allows light from within the amplifier 410C traveling toward the front face 413C to be reflected away from the active region. The normal section 427 allows light from within the amplifier 410C traveling toward the back face 417C to strike the back face 417C at a right angle. The apparatus 400C may include an optical coupler 420C proximate the front face 413C and an optical device 440C proximate the back face 417C. The optical coupler 420C may include a fiber wedge 422C, optically coupled to an optical circulator 424C.

Figure 4F:
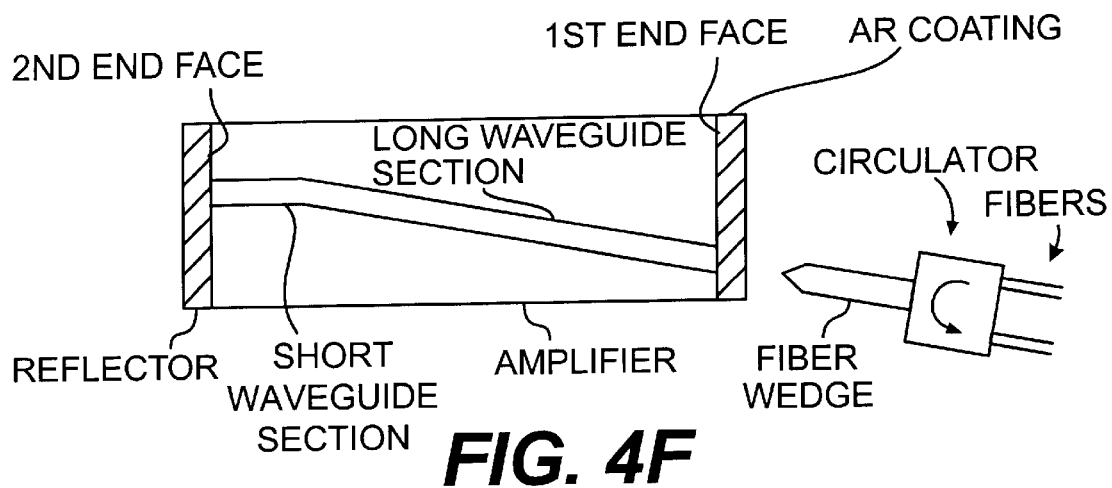
FIGS. 4F–4H depicts simplified schematic top plan views of an communications apparatus according to additional variations of the embodiment of the present invention depicted in FIGS. 4A–4B.
Figure 4G:
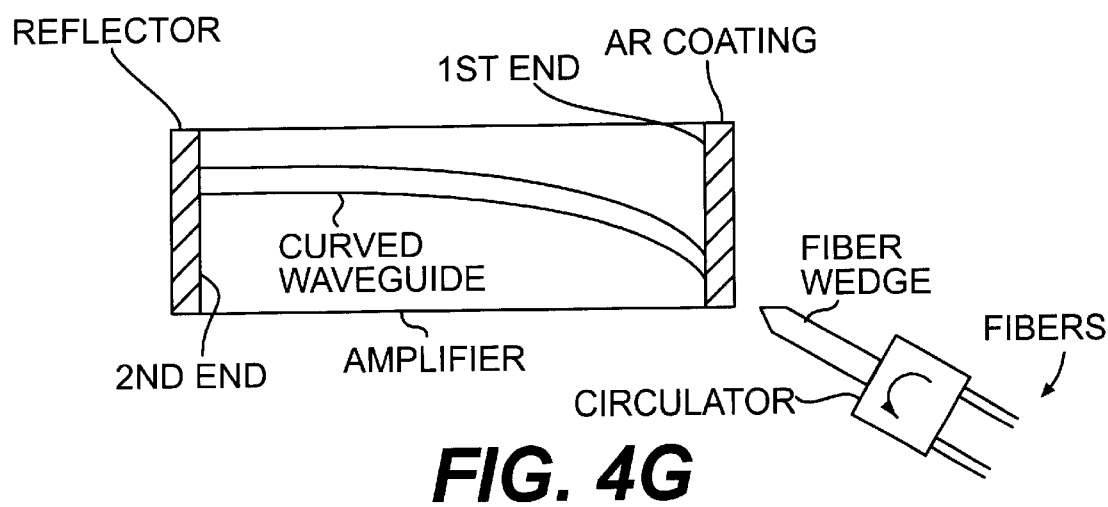
Figure 4H:
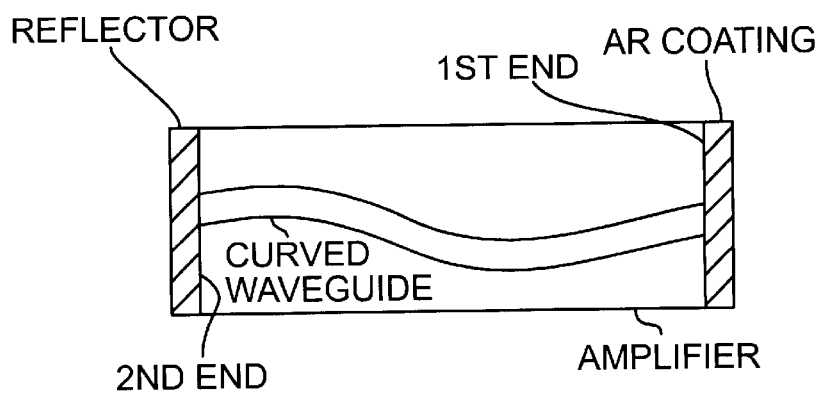

The bent waveguide design shown in FIG. 4C may be varied in may ways. For example, as shown in FIG. 4F, the waveguide may be shaped such that a relatively short section located close to the reflector is oriented substantially perpendicular to the second end face close to the reflector while a longer section intersects the first end face at an angle. Alternatively, the waveguide may be continuously curved as shown in FIGS. 4G, 4H. The curved waveguide may include any number of bends as long as one end is approximately normal to the second and face and the other end intersects the first end face at an angle.

Figure 5:
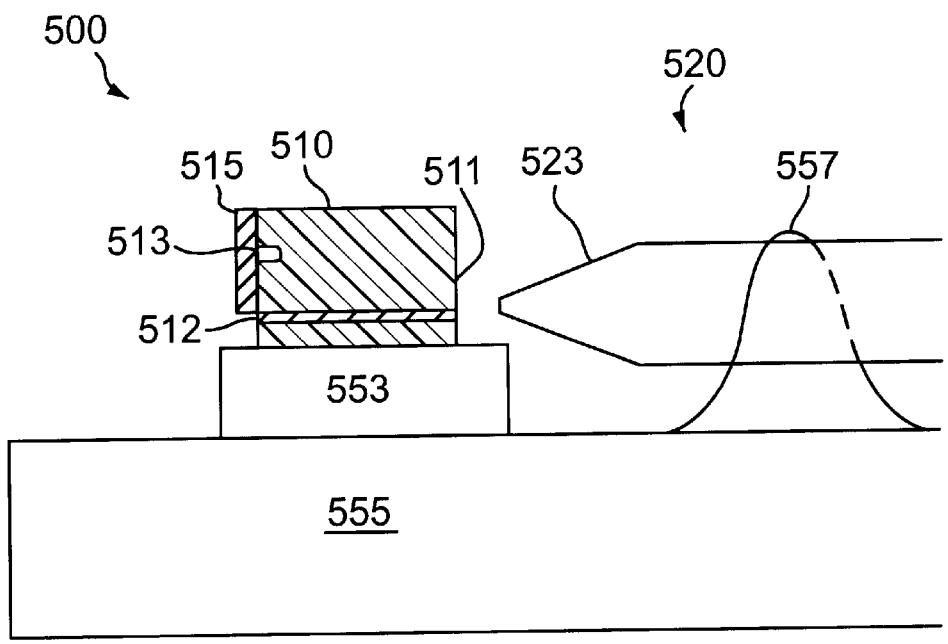
FIG. 5 depicts a side elevational schematic view of an optical communications apparatus according to an embodiment of the present invention.

The double-pass design also facilitates thermal management. Unlike a single-pass SOA, where it is difficult to engineer a heat sink, the double-pass amplifier design simplifies the construction of a heat sink. For example, FIG. 5 depicts an apparatus 500 generally including a double-pass amplifier 510, an optical coupler 520, and a sub-mount 555. The amplifier 510 may contain various types of amplification sections including semiconductor optical amplifiers, rare-earth-doped glass amplifiers such as erbium-doped amplifiers, rare earth doped waveguide amplifiers, such as erbium doped waveguide amplifiers on silicon, glass or polymer substrates, parametric amplifiers or polymer amplifiers. The amplifier 510 includes first and second end faces 511, 513. The optical coupler 520 couples optical signals into and out of the amplifier 510 at the first end face 511. The signals travel through the amplifier 510 along a forward path. A reflector 515 optically coupled to the second end face reflects the signals back though the amplifier along a reverse path toward the first end face 511 that is substantially the same as the forward path. By way of example, the amplifier 510 may be a SOA of the type described above having an active region 512.

The amplifier 510 is mounted to a spacer 553. The spacer 553, in turn, is attached to the sub-mount 555. The amplifier 510 is in thermal contact with the sub-mount 555 through the spacer 553. The sub-mount acts as a heat sink for transporting heat into or out of the amplification section of the amplifier 510. Heat transport may be accomplished by any suitable mechanism such as thermal conduction, convection, radiation, etc. The double pass design of the amplifier 510 frees up space that would normally be taken up by a second optical coupler in a single-pass design. The double-pass design therefore facilitates engineering of a heat sink that is sufficiently large compared to the amplifier to handle the heat produced by optical amplification.

In a particular embodiment, the optical coupler 520 includes a fiber wedge 523 that t is also attached to the sub-mount 555, e.g., by a clip 557. The fiber cladding of the fiber wedge 523 may be coated with gold and the clip 557 may be laser welded to the g old coating. The clip 557 may also be secured to the sub-mount 555 by laser welding. The sub-mount may be made of a thermally conducting material such as copper. The spacer may be made of an electrically insulating material such as AlN, SiC or $Al_2O_3$. The spacer 553 allows for precise alignment of the height of the active region 512 with respect to the fiber wedge 523.

Figure 6:
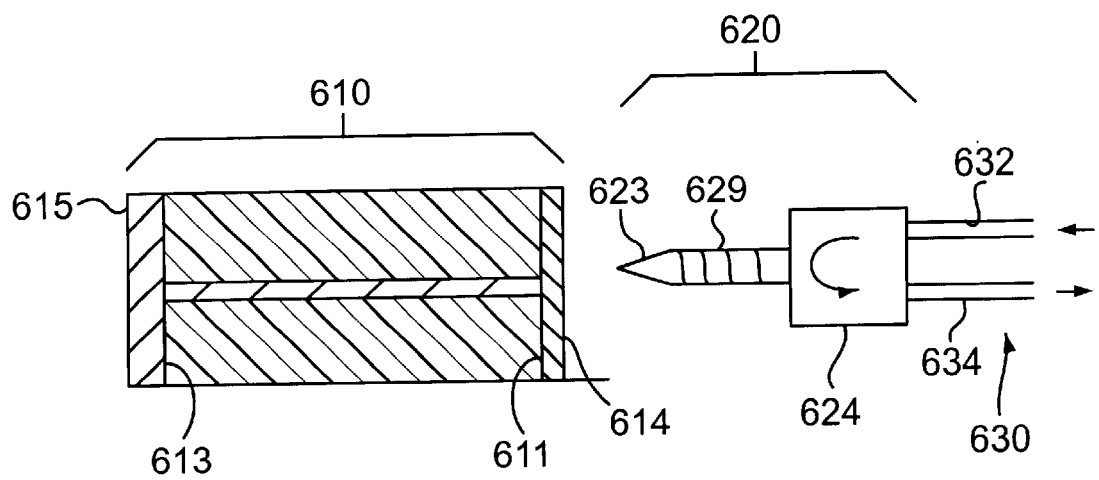
FIG. 6 depicts side elevational schematic view of an optical communications apparatus according to an alternative embodiment of the present invention.

An alternative embodiment of an apparatus is shown in FIG. 6, The apparatus 600 includes a double-pass amplifier 610 coupled to a fiber grating 629 by an optical coupler 620. The amplifier 610 may contain various types of amplification sections including semiconductor optical amplifiers, rare-earth-doped glass amplifiers such as erbium-doped amplifiers, rare earth doped waveguide amplifiers, such as erbium doped waveguide amplifiers on silicon, glass or polymer substrates, parametric amplifiers or polymer amplifiers. By way of example, the amplifier 610 may be an SOA having features in common with amplifiers described above with respect to FIGS. 2A–2C. The amplifier 610 has first and second end faces 611, 613. The optical coupler 620 couples radiation into and out of the amplifier 610 via the first end face 611. The first end face 611 may optionally include an anti-reflection coating 614 to reduce reflection of radiation.

The amplifier 610 includes a reflector 615 optically coupled to the second end face 613 to reflect signals from within the amplifier 610 back toward the first end face 611.

The optical coupler 620 optically couples the amplifier 610 to one or more optical fibers 630. The optical fibers 630 may include an input fiber 632 and an output fiber 634. In a particular embodiment, the coupler 620 includes a fiber wedge 623 coupled to an optical circulator 624.

In the embodiment depicted in FIG. 6, the grating 629 is coupled between the first end face 611 of the amplifier 610 and the optical circulator 624. The grating 629 may be of any type, such as a fiber Bragg grating. The grating 629 selectively reflects radiation having a critical wavelength $\lambda_c$.

The fiber grating 629 and the reflector 615 resonate radiation at $\lambda_c$, which uses up additional gain in the amplifier 610, thereby clamping the gain.

Figure 7:
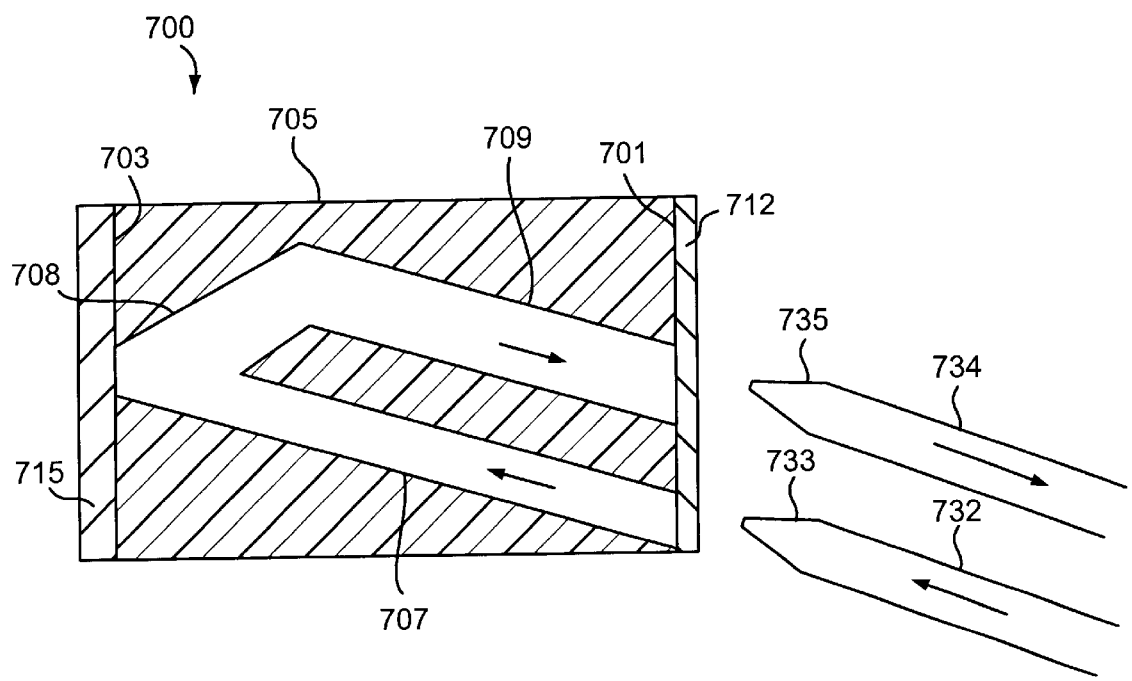
FIG. 7 depicts a schematic top plan view of an optical communications apparatus according to an embodiment of the present invention.

FIG. 7 shows a waveguide amplifier 700 comprising an amplification section 705 having a first end face 701 and a second end face 703, wherein the first end face includes an anti-reflection coating 712, a reflector 715 optically coupled to the second end face, and a waveguide structure 709 for guiding optical signals within the amplification section, the waveguide structure has a first leg 707 and a second leg 709 wherein the first and second legs intersect proximate the second end face and one of the first and second legs is bent (see 708) so that both the first and second legs are substantially parallel to each other proximate the first end face. The amplification section contains an amplifier chosen from the group consisting of semiconductor optical amplifiers, rare-earth-doped amplifiers, rare earth doped waveguide amplifiers, erbium doped waveguide amplifiers on silicon, glass or polymer substrates, parametric amplifiers or polymer amplifiers. The first and second legs are oriented at an angle other than 90° with respect to the first end face.

It will be clear to one skilled in the art that the above embodiment may be altered in many ways without departing from the scope of the invention. For example, the amplifier design may allow for multiple back and forth reflections of optical signals between the reflector and the amplifier input. Accordingly, the scope of the invention should be determined by the following claims and their legal equivalents.

What is claimed is:

1. A waveguide amplifier, comprising:
   a) an amplification section having first and second end faces, wherein the first end face includes an anti-reflection coating;
   b) a reflector optically coupled to the second end face; and
   c) a waveguide structure for guiding optical signals within the amplification section, the waveguide structure having a first leg and a second leg wherein the first and second legs intersect proximate the second end face and one of the first and second legs is bent so that both the first and second legs are substantially parallel to each other proximate the first end face.

2. The waveguide amplifier of claim 1, wherein the amplification section contains an amplifier chosen from the group consisting of semiconductor optical amplifiers, rare-earth-doped amplifiers, rare earth doped waveguide amplifiers, erbium doped waveguide amplifiers on silicon, glass or polymer substrates, parametric amplifiers or polymer, amplifiers.

3. The waveguide amplifier of claim 1, wherein the first and second legs are oriented at an angle other than 90° with respect to the first end face.

* * * * *